(12) United States Patent
Goden

(10) Patent No.: US 11,169,022 B2
(45) Date of Patent: Nov. 9, 2021

(54) PHOTO-DETECTION DEVICE AND IMAGING SYSTEM

(71) Applicant: CANON KABUSHIKI KAISHA, Tokyo (JP)

(72) Inventor: Tatsuhito Goden, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 137 days.

(21) Appl. No.: 16/013,177

(22) Filed: Jun. 20, 2018

(65) Prior Publication Data
US 2018/0372539 A1    Dec. 27, 2018

(30) Foreign Application Priority Data
Jun. 27, 2017    (JP) .............................. JP2017-124862

(51) Int. Cl.
| | |
|---|---|
| *H03K 17/78* | (2006.01) |
| *G01J 1/44* | (2006.01) |
| *H01L 31/107* | (2006.01) |
| *H01L 31/02* | (2006.01) |
| *H01L 27/146* | (2006.01) |
| *B60R 11/04* | (2006.01) |

(Continued)

(52) U.S. Cl.
CPC ................ *G01J 1/44* (2013.01); *B60R 11/04* (2013.01); *G01C 3/085* (2013.01); *H01L 27/14636* (2013.01); *H01L 27/14641* (2013.01); *H01L 27/14643* (2013.01); *H01L 31/02027* (2013.01); *H01L 31/107* (2013.01); *G01J 2001/442* (2013.01); *G01J 2001/4466* (2013.01); *G06T 7/55* (2017.01); *G06T 2207/30261* (2013.01)

(58) Field of Classification Search
CPC ............ H01L 31/107; H01L 31/02027; H01L 27/14636; H01L 27/14641; H01L 27/14643; B60R 11/04; G01J 1/44; G01C 3/085

See application file for complete search history.

(56) References Cited

U.S. PATENT DOCUMENTS

| | | | |
|---|---|---|---|
| 7,512,210 B2 * | 3/2009 | Possin .................... | A61B 6/032 250/370.09 |
| 9,431,439 B2 | 8/2016 | Soga | |
| 9,671,284 B1 * | 6/2017 | Dandin ................ | H03K 5/1534 |

(Continued)

FOREIGN PATENT DOCUMENTS

| | | | | |
|---|---|---|---|---|
| EP | 2130011 B1 * | 9/2018 | ............. | H03K 17/28 |
| JP | 2004-193675 A | 7/2004 | | |

(Continued)

OTHER PUBLICATIONS

Japanese Search Report dated Apr. 1, 2021 in corresponding Japanese application No. 2017-124862, and English translation thereof.

*Primary Examiner* — Georgia Y Epps
*Assistant Examiner* — Kevin Wyatt
(74) *Attorney, Agent, or Firm* — Venable LLP

(57) ABSTRACT

A photo-detection device includes a quench resistor having one terminal connected to a first node, an avalanche photodiode having one terminal connected to a second node, a waveform shaping circuit having an input terminal connected to the other terminal of the quench resistor and the other terminal of the avalanche photodiode, and a switch arranged on a path between the second node and the input terminal of the waveform shaping circuit.

20 Claims, 12 Drawing Sheets

(51) Int. Cl.
*G01C 3/08* (2006.01)
*G06T 7/55* (2017.01)

(56) References Cited

U.S. PATENT DOCUMENTS

| | | | |
|---|---|---|---|
| 9,774,810 B2 | 9/2017 | Tashiro | |
| 9,991,305 B2 | 6/2018 | Goden | |
| 10,812,729 B2 | 10/2020 | Kasuga | |
| 2008/0231339 A1 | 9/2008 | Deschamps | |
| 2008/0290259 A1* | 11/2008 | Mathewson | G01J 1/46 |
| | | | 250/214 R |
| 2011/0315856 A1* | 12/2011 | O'mathuna | G01T 1/00 |
| | | | 250/208.2 |
| 2012/0063789 A1* | 3/2012 | Yuan | G01J 1/44 |
| | | | 398/202 |
| 2012/0158178 A1* | 6/2012 | Hyung | B25J 9/1666 |
| | | | 700/255 |
| 2014/0103196 A1* | 4/2014 | Soga | G01S 7/4865 |
| | | | 250/208.2 |
| 2015/0287841 A1 | 10/2015 | Margulis | |
| 2015/0296161 A1* | 10/2015 | Saito | H01L 27/14607 |
| | | | 250/369 |
| 2016/0148417 A1* | 5/2016 | Kim | G05D 1/0044 |
| | | | 345/419 |
| 2016/0295140 A1 | 10/2016 | Moriyama | |
| 2017/0212221 A1 | 7/2017 | Goden | |

FOREIGN PATENT DOCUMENTS

| | | | |
|---|---|---|---|
| JP | 2010-521825 A | | 6/2010 |
| JP | 2011-3739 | | 1/2011 |
| JP | 2012-60012 | | 3/2012 |
| JP | 2014-81253 A | | 5/2014 |
| JP | 2016-211881 | | 12/2016 |
| JP | 2016-225453 | | 12/2016 |
| JP | 2016225453 A | * | 12/2016 |
| WO | 2016/042734 A1 | | 3/2016 |

* cited by examiner

PHOTO-DETECTION DEVICE AND IMAGING SYSTEM

BACKGROUND OF THE INVENTION

Field of the Invention

The present invention relates to a photo-detection device and an imaging system.

Description of the Related Art

In recent years, semiconductor devices capable of detecting a faint light at a single photon level are desired for application in a wide range of fields. In particular, a use of a photo-detection device which operates in such a way that a signal corresponding to a single photon is larger than noise at signal reading enables so-called photon counting that is to accurately count the brightness of an input light, which has been conventionally handled as continuous values, as a discrete value that is the number of photons.

An example of a photo-detection element for implementing the photon counting may be an avalanche photodiode (APD). An APD can use an avalanche amplification phenomenon (avalanche breakdown phenomenon) generated by an intense electric field induced on a p-n junction of a semiconductor to amplify the amount of signal charges excited by photons several times to one million times. With a use of the high gain characteristic of the avalanche amplification phenomenon, a faint light signal can be amplified sufficiently larger than reading noise, and a brightness resolution at a single photon level can be realized.

Japanese Patent Application Laid-Open No. 2011-003739 discloses a Single Photon Avalanche Diode (SPAD) as an example of the APD that is driven by application of a reverse bias voltage that is higher than a breakdown voltage to the p-n junction. The application of the reverse bias voltage that is higher than the breakdown voltage to an SPAD can realize avalanche amplification of photo-excited charges.

A photo-detection circuit of the SPAD is formed of a series-connected component of the SPAD and a quench resistor and driven by connection of a first power source to one node of the series-connected component and connection of a second power source to the other node. A waveform shaping circuit that outputs a pulse signal, such as an inverter circuit, a comparator, or the like, is connected to a connection node between the SPAD and the quench resistor.

In order to realize reduction in size of such a photo-detection circuit, it is advantageous to configure the waveform shaping circuit with elements that operate at a low voltage such as 1.8V or 3.3V. Thus, the voltages supplied from a first power source and a second power source are optimized such that a low voltage signal is input to the waveform shaping circuit with application of a high voltage higher than or equal to the breakdown voltage to SPAD.

In the configuration of the photo-detection circuit described above, however, when a failure in the second power source connected to the quench resistor or disconnection of the power source line occurs, no current is supplied from the quench resistor, and thus a high voltage may be applied to the input of the waveform shaping circuit. In particular, when a voltage higher than or equal to the withstand voltage of the elements of the waveform shaping circuit is applied, the waveform shaping circuit may be destroyed. Destruction of the waveform shaping circuit may cause a short-circuit failure to occur inside the waveform shaping circuit, a current continues to flow and causes voltage drop and heat generation, and thus the reliability of the device may be impaired. The similar situation may occur when a high voltage is supplied from the first power source to the SPAD without the second power source connected to the quench resistor or when the second power source is cut off earlier than the first power source when powered off.

SUMMARY OF THE INVENTION

An object of the present invention is to provide a reliable photo-detection device that can suppress a high voltage from being applied to a waveform shaping circuit.

According to one aspect of the present invention, there is provided a photo-detection device including a quench resistor having one terminal connected to a first node, a photodiode having one terminal connected to a second node, and being an avalanche photodiode, a waveform shaping circuit having an input terminal connected to the other terminal of the quench resistor and the other terminal of the photodiode, and a switch arranged on a path between the second node and the input terminal of the waveform shaping circuit.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
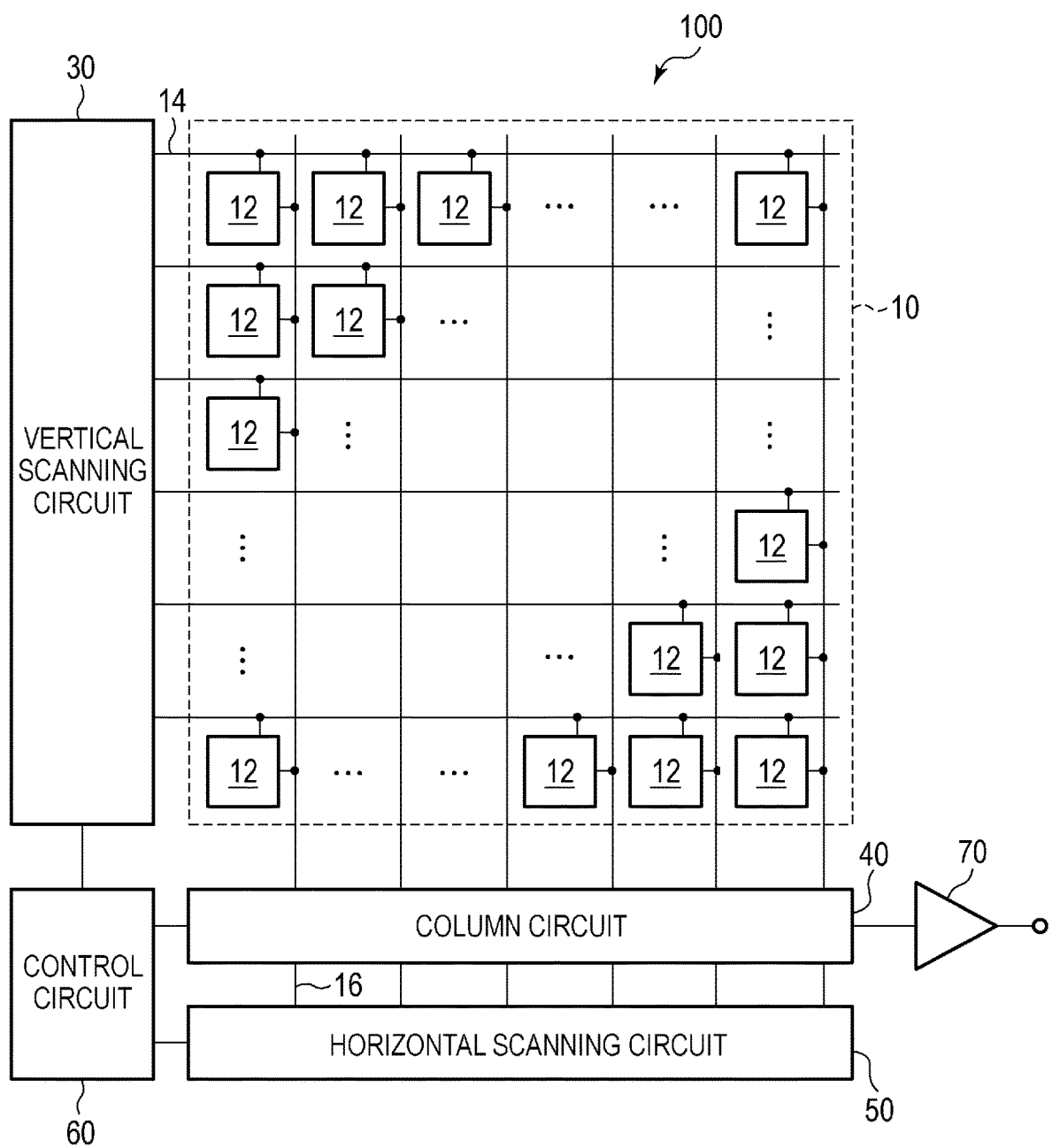
FIG. 1 is a block diagram illustrating a general structure of a photo-detection device according to a first embodiment.
Figure 2A:
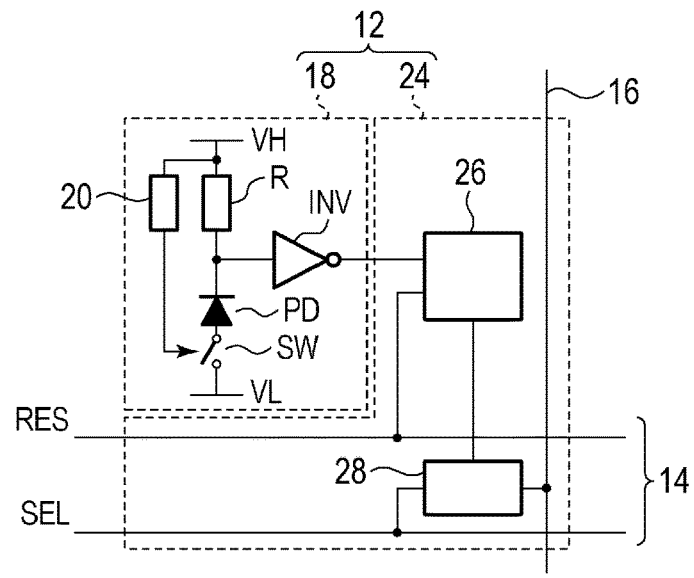
FIG. 2A, FIG. 2B, and FIG. 2C are circuit diagrams illustrating a configuration example of a pixel of the photo-detection device according to the first embodiment.
Figure 2B:
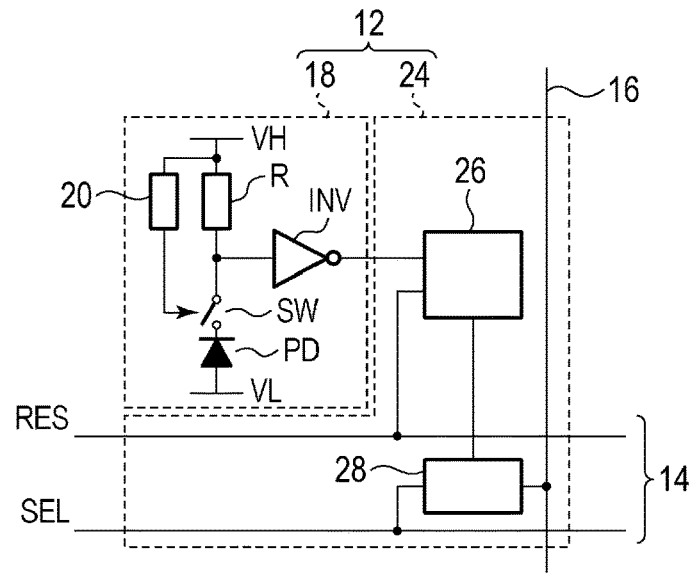
Figure 2C:
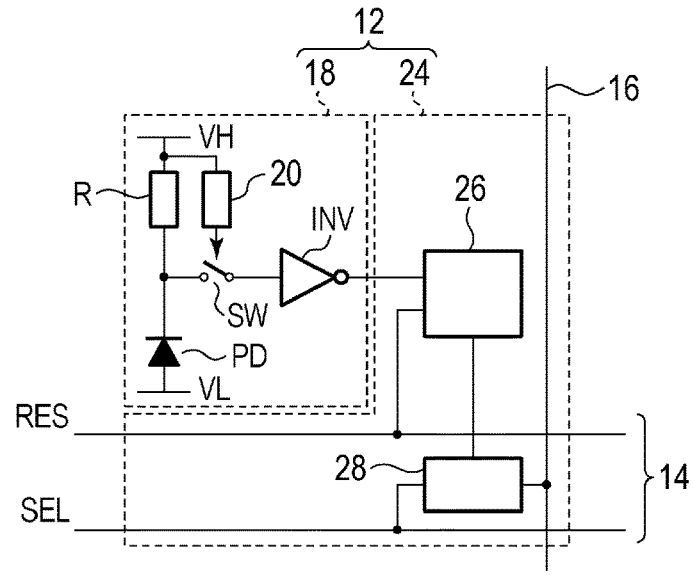
Figure 4:
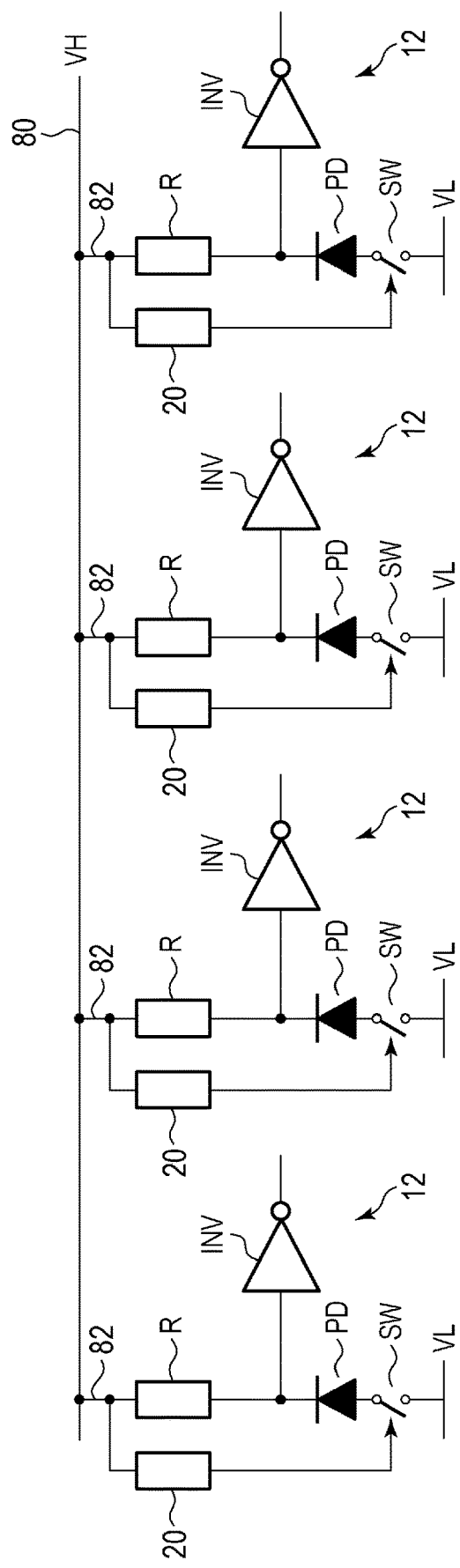
FIG. 4 is a circuit diagram illustrating a configuration example of a pixel region of the photo-detection device according to the first embodiment.
Figure 5:
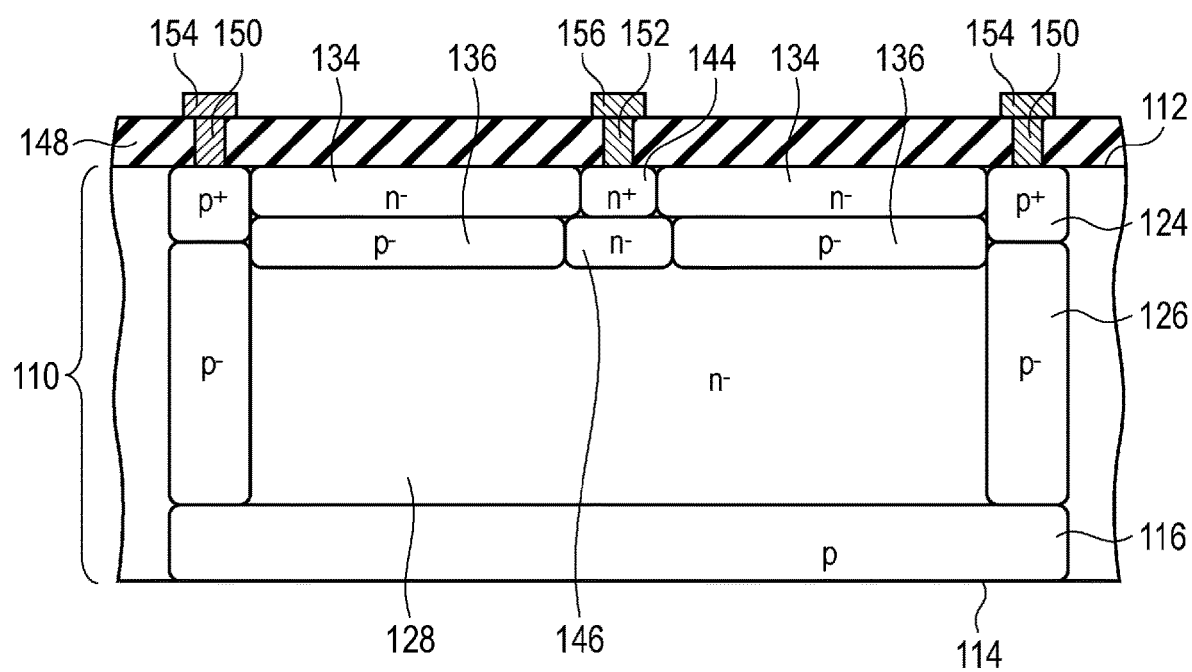
FIG. 5 is a schematic cross-sectional view illustrating the structure of a photoelectric conversion element of the photo-detection device according to the first embodiment.

A photo-detection device according to a first embodiment of the present invention will be described with reference to FIG. 1 to FIG. 6D. FIG. 1 is a block diagram illustrating a general structure of the photo-detection device according to the present embodiment. FIG. 2A to FIG. 2C are circuit diagrams illustrating a configuration example of a pixel of the photo-detection device according to the present embodiment. FIG. 3A to FIG. 3F are circuit diagrams illustrating a configuration example of a switch control circuit of the photo-detection device according to the present embodiment. FIG. 4 is a circuit diagram illustrating a configuration example of a pixel region of the photo-detection device according to the present embodiment. FIG. 5 is a schematic cross-sectional view illustrating the structure of a photoelectric conversion element of the photo-detection device according to the present embodiment. FIG. 6A to FIG. 6D are cross-sectional views illustrating a method of manufacturing the photoelectric conversion element of the photo-detection device according to the present embodiment.

As illustrated in FIG. 1, the photo-detection device 100 according to the present embodiment includes a pixel region 10, a vertical scanning circuit 30, a column circuit 40, a horizontal scanning circuit 50, a control circuit 60, and an output circuit 70.

In the pixel region 10, a plurality of pixels 12 are provided in a matrix over a plurality of rows and a plurality of columns. The number of the pixels 12 of the pixel region 10 may not be limited in particular. For example, the pixel region 10 may be formed of the pixels 12 arranged in thousands of rows by thousands of columns as seen in general digital cameras. Alternatively, the pixel region 10 may be formed of the plurality of pixels 12 arranged in one row or one column. Alternatively, the pixel region 10 may be formed of a single pixel 12.

On each row of the pixel array of the pixel region 10, a control line 14 is arranged extending in a first direction (the horizontal direction in FIG. 1). The control line 14 is connected to the pixels 12 aligned in the first direction, respectively, to form a signal line common to these pixels 12. In the present specification, the first direction in which the control line 14 extends may be referred to as a row direction. Note that, while one control line 14 is arranged on each row in the example of FIG. 1, a plurality of control lines 14 may be arranged on each row to separately control the plurality of pixels 12 arranged on the same row. Note that each control line 14 may be formed of more than one signal lines.

The control line 14 on each row is connected to the vertical scanning circuit 30. The vertical scanning circuit 30 receives a control signal from the control circuit 60 and supplies a control signal used for driving a readout circuit inside the pixel 12 (a pixel signal processing unit 24 described below) to the pixel 12 via the control line 14. For the vertical scanning circuit 30, a logic circuit such as a shift register or an address decoder is used.

On each column of the pixel array of the pixel region 10, a vertical output line 16 is arranged extending in a second direction crossing the first direction (the vertical direction in FIG. 1). The vertical output line 16 is connected to the pixels 12 aligned in the second direction, respectively, to form a signal line common to these pixels 12. In the present specification, the second direction in which the vertical output line 16 extends may be referred to as a column direction.

One end of the vertical output line 16 on each column is connected to a column circuit 40. The vertical output line 16 supplies a signal output from the pixel 12 that is selected by the vertical scanning circuit 30 to the circuit of the following stage of the pixel 12 (the column circuit 40) as a potential signal. Note that, while one vertical output line 16 is arranged on each column in the example of FIG. 1, a plurality of vertical output lines 16 may be arranged on each column to read out a plurality of pixel signals in parallel as an N-bit digital signal, for example. Such a configuration can increase the reading speed.

The column circuit 40 is a circuit unit that performs a predetermined process on a signal read out from each pixel 12 via the vertical output line 16. The predetermined process is a process of performing a noise removal, an amplification, or the like of the input signal and converts it into a form to be output to the outside of the photo-detection device 100. For example, the column circuit 40 includes a parallel-serial conversion circuit.

The horizontal scanning circuit 50 is a circuit unit that supplies, to the column circuit 40, control signals used for transferring pixel signals processed in the column circuit 40 to the output circuit 70 sequentially on a column basis. The control circuit 60 is a circuit unit for supplying control signals that control the operation or timing of the vertical scanning circuit 30, the column circuit 40, and the horizontal scanning circuit 50. The output circuit 70 is formed of a buffer amplifier, a differential amplifier, or the like and is a circuit unit for outputting signals read out from the column circuit 40 to a storage unit or a signal processing unit outside the photo-detection device 100.

Note that, while the vertical scanning circuit 30, the column circuit 40, and the horizontal scanning circuit 50 are arranged in the outer periphery of one pixel region 10 in the example of FIG. 1, the pixel region 10 may be divided into a plurality of blocks, and the vertical scanning circuit 30, the column circuit 40, and the horizontal scanning circuit 50 may be arranged in each block, respectively.

FIG. 2A is a schematic diagram illustrating a configuration example of the pixel 12. As illustrated in FIG. 2A, a single pixel 12 includes a photoelectric conversion unit 18 and a pixel signal processing unit 24. The photoelectric conversion unit 18 includes a photoelectric conversion element PD, a load circuit R, a waveform shaping circuit INV, a switch SW, and a switch control circuit 20. The pixel signal processing unit 24 includes a counter circuit 26 and a select circuit 28.

The photoelectric conversion element PD is formed of a photodiode. One terminal (anode) of the photoelectric conversion element PD is connected to a node to which a voltage VL is supplied from the power source via the switch SW. The other terminal (cathode) of the photoelectric conversion element PD is connected to a node to which a voltage VH higher than the voltage VL is supplied from the power source via the load circuit R. The switch SW is a switch whose connection state (conductive state or non-conductive state) is controlled by the switch control circuit 20. The switch control circuit 20 is connected to a node to which the voltage VH is supplied from the power source. The input terminal of the waveform shaping circuit INV is connected to a connection node between the photoelectric conversion element PD and the load circuit R. The output terminal of the waveform shaping circuit INV is connected to the counter circuit 26. The counter circuit 26 is connected to the vertical output line 16 via the select circuit 28.

In the configuration example in FIG. 2A, the control line 14 on each row includes a reset signal line RES and a select signal line SEL. The reset signal line RES is connected to the counter circuits 26 of the pixels 12 belonging to the corresponding row, respectively. The select signal line SEL is connected to the select circuits 28 of the pixels 12 belonging to the corresponding row, respectively.

The photoelectric conversion element PD is a photodiode using avalanche amplification (avalanche breakdown). The photoelectric conversion element PD is used in a state being applied with a reverse bias voltage and generates a charge pair corresponding to an incident light by photoelectric conversion. When the potential difference between the anode and the cathode of the photoelectric conversion element PD is larger than the avalanche breakdown voltage of the photodiode, the photodiode operates in a Geiger-mode. An SPAD is a photodiode that detects a faint signal in a single photon level at a high speed using a Geiger-mode operation. Further, when the potential difference between the anode and the cathode of the photoelectric conversion element PD is larger than or equal to the potential difference at which charges generated in the photoelectric conversion element PD cause avalanche amplification and is smaller than or equal to the breakdown voltage, the avalanche diode operates in a linear mode. The avalanche diode that performs photo-detection in a linear mode is referred to as an avalanche photodiode (APD). In the present embodiment, while the following description will be provided on the assumption that the photoelectric conversion element PD is operated in a Geiger-mode and used as the SPAD, the present invention is also applicable to a case where the photoelectric conversion element PD is used in any of the operation modes.

The load circuit R has a function of replacing a photoelectric current generated in the photoelectric conversion element PD with a voltage signal. Further, the load circuit R functions as a load circuit (quench circuit) during the signal amplification by avalanche amplification and suppresses avalanche amplification by reducing the voltage supplied to the photoelectric conversion element PD (quenching operation). From such a point of view, in the present specification, the load circuit R may be referred to as a quench resistor. As the load circuit, for example, a resistor, a transistor, or an active quench circuit that actively suppresses avalanche amplification by detecting an increase in the avalanche current and performing feedback control may be used.

The waveform shaping circuit INV shapes a voltage change obtained at detection of a photon level signal and outputs a pulse signal. As the waveform shaping circuit INV, for example, an inverter circuit is used. While an example in which the waveform shaping circuit INV is formed of a single inverter circuit is illustrated in FIG. 2A, FIG. 2B, and FIG. 2C, a circuit formed of a plurality of inverter circuits connected in series or another circuit having waveform shaping effect may be used. Further, a more complex circuit that can enhance the waveform shaping effect, such as a comparator, may be used.

The switch control circuit 20 is a circuit that is connected to a node supplied with the voltage VH from the power source and outputs a control signal used for controlling the switch SW in accordance with the voltage at the node. The switch control circuit 20 supplies, to the switch SW, a control signal used for controlling the switch SW to an on-state (conductive state) when the voltage VH is supplied to the node. On the other hand, the switch circuit 20 supplies, to the switch SW, a control signal used for controlling the switch SW to an off-state (non-conductive state) when the voltage VH is not supplied to the node.

When the pixel circuits of any one of FIG. 2A, FIG. 2B and FIG. 2C is applied, the power source for supplying the voltage VL is a high voltage power source. This high voltage power source typically generates a potential difference larger than the withstand voltage of the low voltage operation element forming the waveform shaping circuit INV. If the switch SW is not provided and the voltage VL is supplied while the voltage VH is not supplied, a high voltage is applied to the input terminal of the waveform shaping circuit INV, and the waveform shaping circuit INV may be destroyed. With the switch SW and the switch control circuit 20 being provided, however, the connection between the power source supplying the voltage VL and the waveform shaping circuit INV is cut off when the voltage VH is not supplied, and it is therefore possible to prevent the waveform shaping circuit INV from being destroyed.

The counter circuit 26 counts pulse signals output from the waveform shaping circuit INV. For example, when the counter circuit 26 is formed of N bits (N is a positive integer), pulse signals with a single photon can be counted up to around the N-th power of 2 at the maximum. A digital signal (a count value) indicating the brightness of the light held in the counter circuit 26 can be reset by a control signal supplied via the reset signal line RES. The select circuit 28 outputs the digital signal held in the counter circuit 26 to the vertical output line 16 in accordance with the control signal supplied via the select signal line SEL.

The select signal line SEL, a signal line between the counter circuit 26 and the select circuit 28, a signal line between the select circuit 28 and the vertical output line 16, and the vertical output line 16 may be formed of a plurality of interconnections. In this case, the select circuit 28 is controlled by a control signal supplied via one or more select signal lines SEL and outputs a digital signal held in the counter circuit 26 to one or more vertical output lines 16. The select circuit 28 may be formed of transistors provided to each interconnection that connects the counter circuit 26 and the vertical output line 16 to each other and may include a buffer circuit or the like for outputting a signal to the outside of the pixel 12.

Note that it is not absolutely necessary for each pixel 12 to have the function of the pixel signal processing unit 24. For example, the plurality of pixels 12 may share a single pixel signal processing unit 24, and the signal processing of each pixel 12 may be sequentially performed in the pixel signal processing unit 24. Further, in order to increase an aperture ratio of the photoelectric conversion unit 18, the photoelectric conversion unit 18 and the pixel signal processing unit 24 may be provided on different substrates, and these substrates may be stacked. In this case, the photoelectric conversion unit 18 and the pixel signal processing unit 24 are connected to each other via an interconnection provided for each pixel 12. The vertical scanning circuit 30, the column circuit 40, the horizontal scanning circuit 50, or the like may also be provided on a different substrate from the photoelectric conversion unit 18.

When the reset signal line RES and the select signal line SEL are provided as signal lines common to respective rows, rolling shutter imaging can be enabled by resetting the held signal of the pixel 12 sequentially on a row basis and then reading out the signal of the pixel 12 sequentially on a row basis after a certain exposure period. Further, global shutter imaging can be realized by supplying common reset signals to all the pixels 12 to simultaneously control the exposure period and sequentially reading out the held signals.

When performing the global shutter operation, in addition to the pixel configuration of FIG. 2A, it is desirable to provide a switch unit that performs switching between the case of counting the pulse signals caused by a light and the case of not counting the pulse signals caused by a light. For example, by performing switching between the voltage of the power source that supplies the voltage VH and the voltage of the power source that supplies the voltage VL to perform switching between a state where avalanche amplification is generated and a state where no avalanche amplification is generated, it is also possible to perform switching between a light receiving period and a non-light receiving period of a light signal. Alternatively, by using a variable resistor as the load circuit R to perform switching between a state where avalanche amplification is generated and a state where no avalanche amplification is generated, it is also possible to perform switching between the light receiving period and the non-light receiving period of a light signal. Alternatively, by controlling a switch SW provided between the waveform shaping circuit INV and the counter circuit 26 from the outside of the pixel 12, it is also possible to perform switching between a state where the optical pulse signal is input to the counter circuit 26 and a state where a fixed potential such as the ground is input and no light signal is counted.

FIG. 2B and FIG. 2C are schematic diagrams illustrating other configuration examples of the pixel 12. FIG. 2B is a configuration example in which the switch SW is arranged between the photoelectric conversion element PD and the load circuit R, and the input terminal of the waveform shaping circuit INV is connected to the connection node between the photoelectric conversion element PD and the load circuit R. FIG. 2C is a configuration example in which the switch SW is arranged between the connection node between the photoelectric conversion element PD and the load circuit R and the input terminal of the waveform shaping circuit INV. Also in the configuration examples illustrated in FIG. 2B and FIG. 2C, it is possible to prevent the waveform shaping circuit INV from being destroyed by cutting off the connection between the power source supplying the voltage VL and the waveform shaping circuit INV when the voltage VH is not supplied. The arrangement location of the switch SW may be any position as long as it is on the path (an electric path) that connects the node supplied with the voltage VL from the power source to the input terminal of the waveform shaping circuit INV via the photoelectric conversion element PD.

Next, a specific configuration example of the switch SW and the switch control circuit 20 will be described by using FIG. 3A to FIG. 3F. While FIG. 3A to FIG. 3F illustrate examples applied to the photoelectric conversion unit 18 of the pixel 12 of the circuit configuration illustrated in FIG. 2A, it is similarly applicable in the pixel 12 of the circuit configurations illustrated in FIG. 2B and FIG. 2C.

Figure 3A:
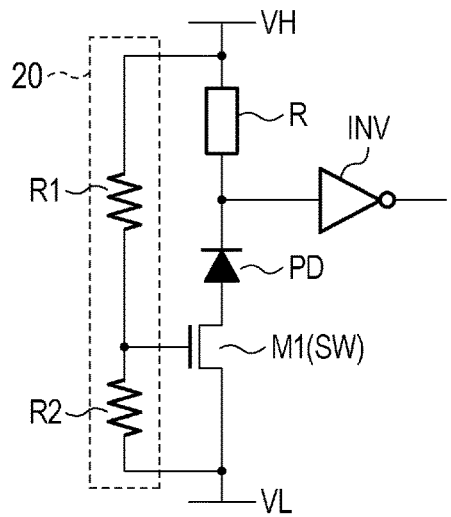
FIG. 3A, FIG. 3B, FIG. 3C, FIG. 3D, FIG. 3E, and FIG. 3F are circuit diagrams illustrating a configuration example of a switch control circuit of the photo-detection device according to the first embodiment.

FIG. 3A is an example in which the switch SW is formed of an n-channel MOS transistor M1 and the switch control circuit 20 is formed of resistors R1 and R2. The resistor R1 and the resistor R2 are connected in series between the power source supplying the voltage VH and the power source supplying the voltage VL, and the voltage obtained by dividing the potential difference between the voltage VH and the voltage VL by the resistors R1 and R2 is input to the gate of the n-channel MOS transistor M1. That is, the switch control circuit 20 includes impedance elements (the resistors R1, R2) which define the voltage of the control signal supplied to the switch SW. The voltage input to the gate of the n-channel MOS transistor M1 is set to be higher than or equal to the threshold voltage of the n-channel MOS transistor M1 and lower than or equal to the gate breakdown voltage. In a state where the voltages VH and VL are supplied, the voltage by which the n-channel MOS transistor M1 that is the switch SW is turned on is input to the gate of the n-channel MOS transistor M1. In a state where the voltage VH is not supplied, the voltage is pulled down by the resistor R2, and the voltage VL is input to the gate of the n-channel MOS transistor M1. As a result, the n-channel MOS transistor M1 is turned off.

Figure 3B:
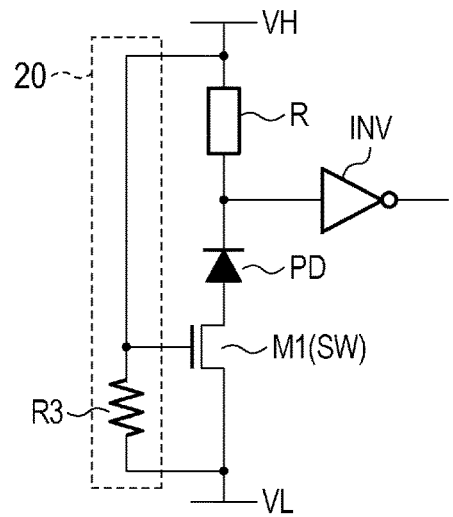

FIG. 3B is an example in which the switch SW is formed of the n-channel MOS transistor M1 and the switch control circuit 20 is formed of a resistor R3. The voltage VH is directly input to the gate of the n-channel MOS transistor M1, and the resistor R3 is connected between the gate of the n-channel MOS transistor M1 and the power source supplying the voltage VL. In this case, since a high voltage is applied to the gate of the n-channel MOS transistor M1, a MOS transistor with a high withstand voltage is used for the n-channel MOS transistor M1. As a MOS transistor with a high withstand voltage, a double diffused MOSFET (DMOS) having a double diffused layer structure or a MOS transistor having a field insulating film as the gate insulating film can be used. The configuration of FIG. 3B has a merit that the layout area can be reduced.

Figure 3C:
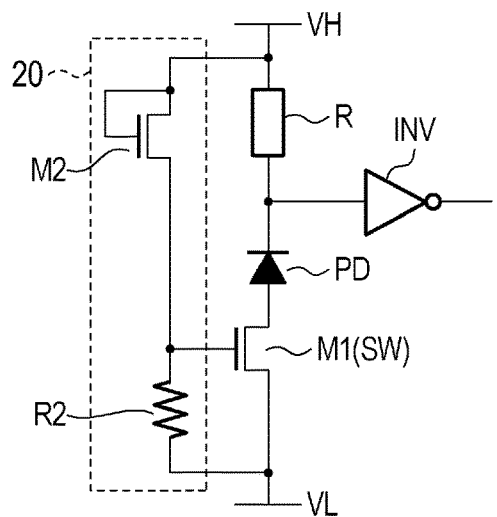

FIG. 3C is an example using an n-channel MOS transistor M2 instead of the resistor R1 in the FIG. 3A. The drain and the gate of the n-channel MOS transistor M2 are connected to the power source suppling the voltage VH, and the source of the n-channel MOS transistor M2 is connected to the connection node of the gate of the n-channel MOS transistor M1 and the resistor R2. The layout area can be reduced by using the n-channel MOS transistor M2 instead of the resistor R1. Further, the degree of flexibility in the setting of the resistance value can be improved. While the gate and the drain of the n-channel MOS transistor M2 are connected to each other in the example of FIG. 3C, another power source may be prepared and configured to apply a constant voltage to the gate. Further, instead of the n-channel MOS transistor M2, a p-channel MOS transistor may be used.

Figure 3D:
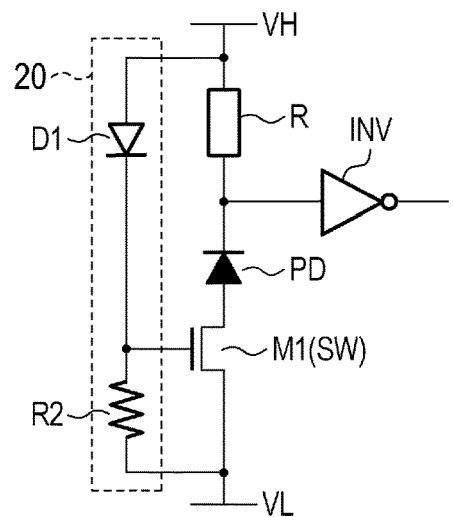

FIG. 3D is an example using a diode D1 instead of the resistor R1 in FIG. 3A. The anode of the diode D1 is connected to the power source supplying the voltage VH, and the cathode of the diode D1 is connected to the connection node of the gate of the n-channel MOS transistor M1 and the resistor R2. The layout area can be reduced also by using the diode D1 instead of the resistor R1.

Figure 3E:
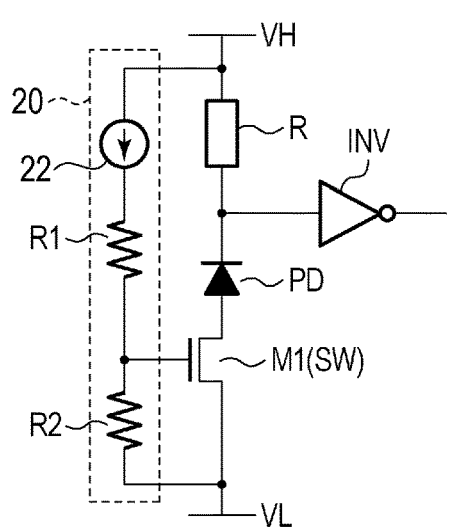

FIG. 3E is an example in which a constant current source 22 is added to the configuration of FIG. 3A. The constant current source 22 is connected between the power source supplying the voltage VH and the resistor R1. With this configuration, since the currents flowing through the resistors R1 and R2 can be defined by the constant current source 22, it is possible to reduce power consumption by reducing the amount of current.

Figure 3F:
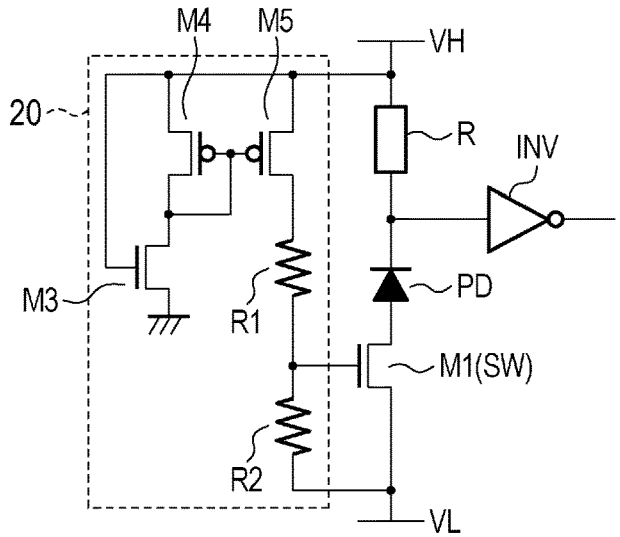

FIG. 3F illustrates a specific circuit example of the constant current source 22 in the configuration of FIG. 3E. The constant current source 22 can be formed of an n-channel MOS transistor M3 and p-channel MOS transistors M4 and M5, for example. The gate of the n-channel MOS transistor M3 and the sources of the p-channel MOS transistors M4 and M5 are connected to the power source supplying the voltage VH. The source of the n-channel MOS transistor M3 is connected to the ground potential. The drain of the n-channel MOS transistor M3 is connected to the gates of the p-channel MOS transistors M4 and M5 and the drain of the p-channel MOS transistor M4. The drain of the p-channel MOS transistor M5 is connected to the resistor R1. The p-channel MOS transistor M4 and the p-channel MOS transistor M5 form a current mirror circuit.

When the voltage VH is supplied, the n-channel MOS transistor M3 is in an on-state, the current flows through the p-channel MOS transistor M4, and the equivalent current flows through the p-channel MOS transistor M5. As a result, a voltage determined by the current flowing through the resistors R1 and R2 and the p-channel MOS transistor M5 is applied to the gate of the n-channel MOS transistor M1, and the n-channel MOS transistor M1 is turned on. On the other hand, when the voltage VH is not supplied, the n-channel MOS transistor M3 is in an off-state, no current flows through the p-channel MOS transistors M4 and M5, and the n-channel MOS transistor M1 is in an off-state.

It is also possible to insert a resistor or another transistor between the n-channel MOS transistor M3 and the p-channel MOS transistor M4 so that the current value flowing through the p-channel MOS transistors M4 and M5 can be set to any value.

In all the above configurations of the switch control circuit 20, a current flows through the impedance element inserted between the node to which the voltage VH is supplied from the power source and the node to which the voltage VL is supplied from the power source, and the switch SW is controlled by the voltage generated in the impedance element.

FIG. 4 is a circuit diagram illustrating an example of a supply path (an electric path) of the voltage VH from the power source to each pixel 12. For simplicity here, an example of a path (an electric path) for supplying the voltage VH to four pixels 12 is illustrated. Further, in FIG. 4, only the portion corresponding to the photoelectric conversion unit 18 is illustrated out of the components of the pixel 12.

Interconnections that supply the voltage VH from the power source to respective pixels 12 are formed of a common interconnection 80 and branch interconnections 82 that branch from the common interconnection 80 to respective pixels 12. The branch interconnections 82 are connected to the load circuits R and the switch control circuits 20 of respective pixels 12. According to such a configuration, for example, even in the state in which a disconnection occurs at the connection part between the common interconnection 80 and the branch interconnection 82 and thus the voltage VH cannot be supplied to the load circuit R, the supply of the voltage VL to the pixel 12 is cut off, and the voltage VL can be prevented from being applied to the waveform shaping circuit INV on a pixel basis. While the disconnected pixel 12 is in a non-driven state and no output is obtained, it is possible to interpolate the output of the defective pixel from the outputs of the surrounding pixels 12 to generate data.

FIG. 5 is a schematic cross-sectional view illustrating a configuration example of the photoelectric conversion element PD of the photo-detection device according to the present embodiment.

The photoelectric conversion element PD of each pixel 12 is formed in the semiconductor substrate 110. The semiconductor substrate 110 is, for example, a semiconductor substrate of a first conductivity type. In one example, the first conductivity type is the n-type. The semiconductor substrate 110 includes a first surface 112 and a second surface 114 opposite to the first surface 112. For example, the first surface 112 is the top surface of the semiconductor substrate 110, and the second surface 114 is the back surface of the semiconductor substrate 110.

The semiconductor region 128 of the first conductivity type is provided in the semiconductor substrate 110. The semiconductor region 128 is divided by an isolation portion into regions each corresponding to a single pixel 12. The photoelectric conversion element PD of a single pixel 12 is arranged in each semiconductor region 128 defined by the isolation portion.

The isolation portion that includes a second conductivity type semiconductor region 124 in contact with the first surface 112 of the semiconductor substrate 110 and a second conductivity type semiconductor region 126 arranged in contact with the second surface 114 side of the semiconductor region 124 and arranged so as to surround the semiconductor region 128 in a plan view. In one example, the second conductivity type is the p-type. The second surface 114 side of the semiconductor region 126 is in contact with a second conductive type semiconductor region 116. The semiconductor region 116 defines a depth where the photoelectric conversion element PD has a sensitivity.

In the semiconductor region 128, an avalanche diode of the photoelectric conversion element PD is arranged. The photoelectric conversion element PD includes the first conductivity type semiconductor regions 134, 144, and 146 and the second conductivity type semiconductor region 136. The semiconductor region 144 is arranged in contact with the first surface 112 of the semiconductor substrate 110. The semiconductor region 134 is arranged in contact with the first surface 112 of the semiconductor substrate 110 so as to surround the semiconductor region 144. The semiconductor region 146 is arranged in contact with the second surface 114 side of the semiconductor region 144. The semiconductor region 136 is arranged in contact with the second surface side of the semiconductor region 134.

An insulating film 148 is provided over the semiconductor substrate 110 in which the photoelectric conversion element PD is provided. An interconnection 154 connected to the semiconductor region 124 via a contact plug 150 and an interconnection 156 connected to the semiconductor region 144 via a contact plug 152 are provided over the insulating film 148. The voltage VL is supplied to the semiconductor region 124 via the interconnection 154 and the contact plug 150. The semiconductor region 144 is connected to the connection node between the load circuit R and the waveform shaping circuit INV via the contact plug 152 and the interconnection 156.

The operation of the photoelectric conversion element PD illustrated in FIG. 5 will be described below with a case where the first conductivity type is the n-type and the second conductivity type is the p-type as an example.

A reverse bias voltage is applied between the n-type semiconductor region 144 and the p-type semiconductor region 124 via interconnections 156 and 154. By setting the impurity concentration of the n-type semiconductor region 134 lower than that of the n-type semiconductor region 144, the electric field between the n-type semiconductor region 144 and the p-type semiconductor region 124 is mitigated. The n-type semiconductor region 134 may have a concentration distribution in the in-plane direction and may be the n-type around the n-type semiconductor region 144 or the p-type around the p-type semiconductor region 124, for example.

A voltage is applied to the p-type semiconductor regions 136, 126, and 116 via the p-type semiconductor region 124. It is desirable that the impurity concentration of the p-type semiconductor region 124 be set higher than those of the p-type semiconductor regions 136, 126, and 116 to reduce the contact resistance with respect to the contact plug 150. It is desirable that the semiconductor region 146 be either the n-type or the p-type in which the concentration is lower than that of the p-type semiconductor region 136. Further, it is desirable that the semiconductor region 128 be the n-type in which the concentration is lower than that of the n-type semiconductor region 144 or the p-type in which the concentration is lower than that of the p-type semiconductor region 126.

Note that, while the semiconductor region 128 and the semiconductor region 146 are described as being different regions in the present embodiment, the semiconductor region 146 and the semiconductor region 128 may be a continuous area formed at substantially the same impurity concentration. For example, it may be a case where no additional ion implantation is performed in any of the regions and the impurity concentrations of the semiconductor regions 128 and 146 are both equal to the substrate concentration or a case where the impurity concentrations of the semiconductor regions 128 and 146 are defined by the concentration of the well formed by using the same mask.

Consider that electron-hole pairs are generated in the n-type semiconductor region 128 by photons incident in the photoelectric conversion element PD. Due to drift transport caused by a potential gradient or due to diffusion transport caused by a carrier concentration gradient, photo-excited holes are discharged from the interconnection 154 via at least one region of the p-type semiconductor regions 116, 124, 126, and 136. On the other hand, photo-excited electrons are attracted to the n-type semiconductor region 144 having a high potential. At this time, the p-type semiconductor region 136 acts as a barrier for electron transport and prevents photo-excited electrons from entering the low concentration n-type semiconductor region 134. With this barrier structure, the electrons reach the n-type semiconductor region 144 after passing through the portion of the n-type semiconductor region 146 having a relatively low potential barrier.

When the voltage applied between the interconnection 154 and the interconnection 156 is sufficiently high, a strong electric field in a direction perpendicular to the surface of the semiconductor substrate 110 is induced in the n-type semiconductor region 146, on the upper surface thereof, or on the under surface thereof. This electric field causes the photo-excited electrons to induce avalanche amplification, and the amplified electrons and electron hole current can be read out from the interconnections 154 and 156.

Next, a method of manufacturing the photoelectric conversion element PD of the photo-detection device according to the present embodiment will be described by using FIG. 6A to FIG. 6D.

Figure 6A:
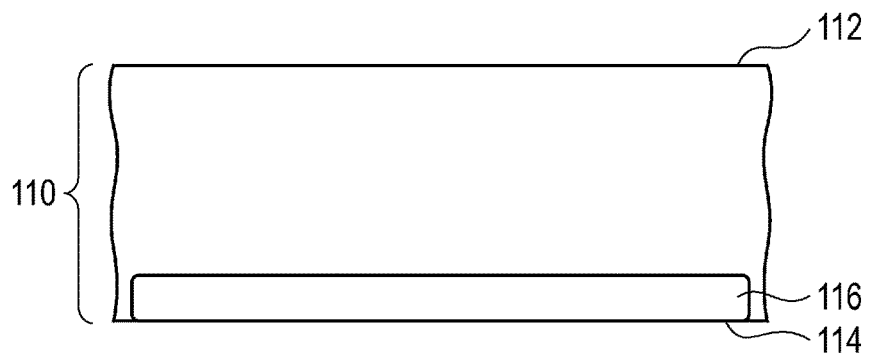
FIG. 6A, FIG. 6B, FIG. 6C, and FIG. 6D are cross-sectional views illustrating a method of manufacturing the photoelectric conversion element of the photo-detection device according to the first embodiment.

First, a p-type impurity ions are implanted into the n-type semiconductor substrate 110 to form the p-type semiconductor region 116 at a position deeper than the first surface 112 of the semiconductor substrate 110 (FIG. 6A).

Next, a photoresist film 118 having an opening 120 in the element isolation region surrounding the region that forms the photoelectric conversion element PD is formed by photolithography.

Figure 6B:
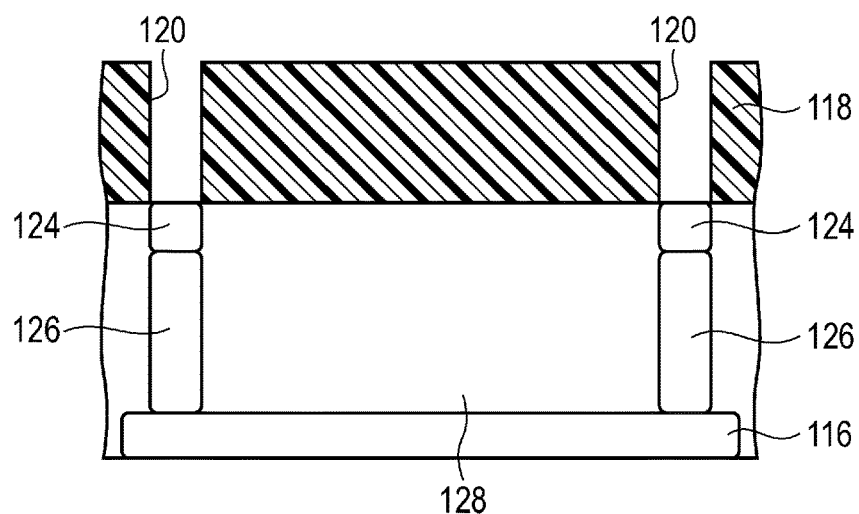

Then, the p-type impurity ions are implanted to form the p-type semiconductor regions 124 and 126 by using the photoresist film 118 as a mask. Thereby, in the semiconductor substrate 110, an n-type semiconductor region 128 isolated from another portion of the semiconductor substrate 110 by the p-type semiconductor regions 116, 124, and 126 is defined (FIG. 6B). Note that the p-type semiconductor substrate as the semiconductor substrate 110 may be used to define a p-type semiconductor region isolated from another portion of the semiconductor substrate 110 by the p-type semiconductor regions 116, 124, and 126.

Next, after the photoresist film 118 is removed, a photoresist film 130 having an opening 132 above the n-type semiconductor region 128 is formed by photolithography.

Figure 6C:
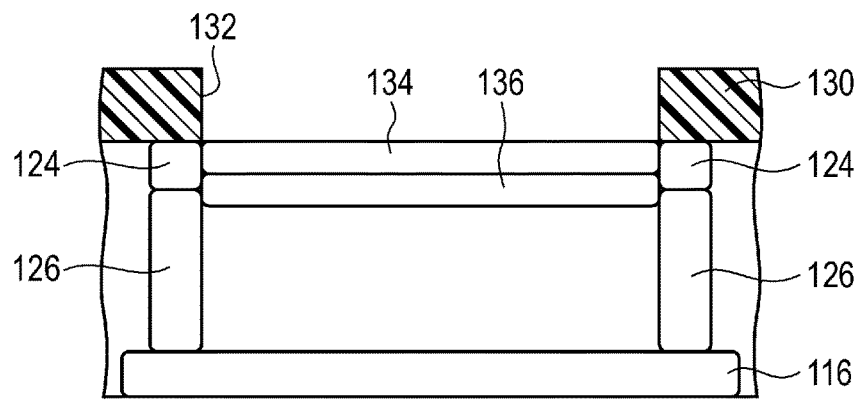

Next, an n-type impurity ions are implanted to form the n-type semiconductor region 134 in the surface of the n-type semiconductor region 128 by using the photoresist film 130 as a mask. Further, a p-type impurity ions are implanted to form the p-type semiconductor region 136 under the n-type semiconductor region 134 by using the photoresist film 130 as a mask (FIG. 6C).

Next, after the photoresist film 130 is removed, a photoresist film 138 having an opening 140 in the center of the p-type semiconductor region 134 is formed by photolithography.

Figure 6D:
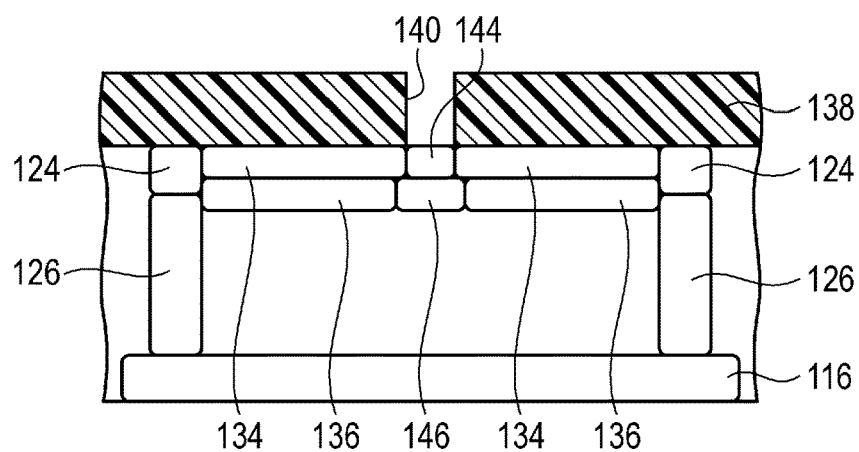

Next, an n-type impurity ions are implanted to form the n-type semiconductor region 144 whose impurity concentration is higher than that of the n-type semiconductor region 134 at a depth where the n-type semiconductor region 134 is provided by using the photoresist film 138 as a mask. Further, an n-type impurity ions are implanted to form the n-type semiconductor region 146 under the n-type semiconductor region 144 by using the photoresist film 138 as a mask (FIG. 6D). The n-type semiconductor region 146 is formed by implanting the n-type impurity ions that is sufficient to invert the conductivity type of the p-type semiconductor region 136. However, this region may not necessarily be inverted to the n-type but may be the p-type semiconductor region where a carrier concentration is locally lower than the p-type semiconductor region 136.

Note that, when the n-type semiconductor regions 144 and 146 are formed by using different masks, positional shift may occur resulting in an asymmetric electric field distribution. For example, when the positional shift causes the planar overlap of the n-type semiconductor region 144 and the p-type semiconductor region 136, electric field concentration occurs in the overlapped portion, and a dark count rate (DCR) increases as a dark current increases due to a tunneling current. According to the manufacturing method illustrated in FIG. 6A to FIG. 6D, the positional shift of the n-type semiconductor regions 144 and 146 can be prevented, and a dark current can be suppressed.

In general, when ion-implantation is performed with the same ion species, diffusion of ions in the lateral direction becomes larger in ion implantation into a deep region than in ion implantation into a shallow region. Therefore, even when ion implantation is performed by using the same mask, it is possible to realize a relationship such that the n-type semiconductor region 144 is included in the n-type semiconductor region 146 in a plan view.

When the size of the n-type semiconductor region 146 relative to the n-type semiconductor region 144 is intended to be adjusted for more precise design of the potential distribution, ion species with different thermal diffusion coefficients may be used as the ion species used for implantation to form the n-type semiconductor regions 144 and 146. Therefore, while the positional shift of the n-type semiconductor regions 144 and 146 is suppressed, the magnitude relationship in the in-plane direction of the n-type semiconductor regions 144 and 146 can be adjusted by using the thermal load performed after the ion implantation, and the flexibility of the potential design can be improved.

Note that the steps illustrated in FIG. 6A to FIG. 6D are not in particular order, and the order of respective steps can be arbitrarily exchanged.

As described above, according to the present embodiment, since a switch that is driven in accordance with the connection state of the power source is provided to prevent a high voltage from being applied to the waveform shaping circuit, a reliable photo-detection device can be realized.

Second Embodiment

Figure 7A:
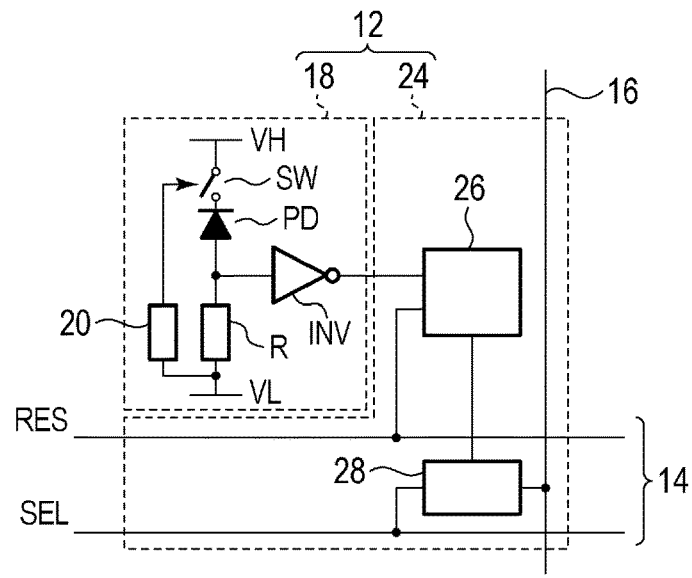
FIG. 7A, FIG. 7B, and FIG. 7C are circuit diagrams illustrating a configuration example of a pixel of a photo-detection device according to a second embodiment.
Figure 7B:
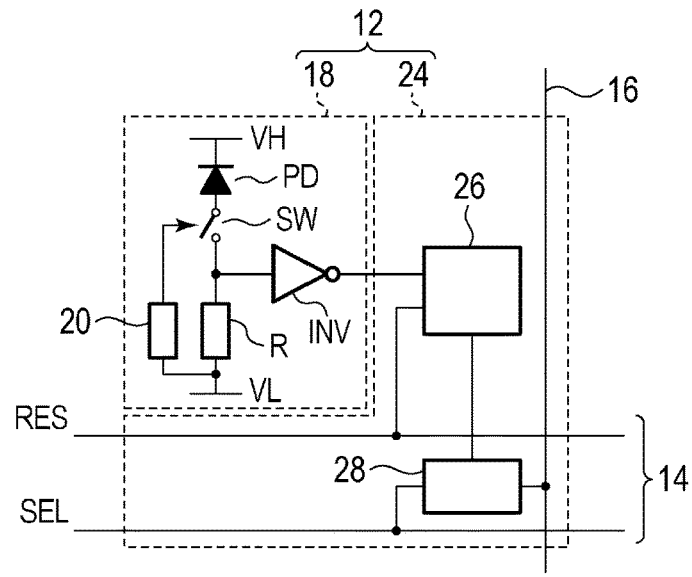
Figure 7C:
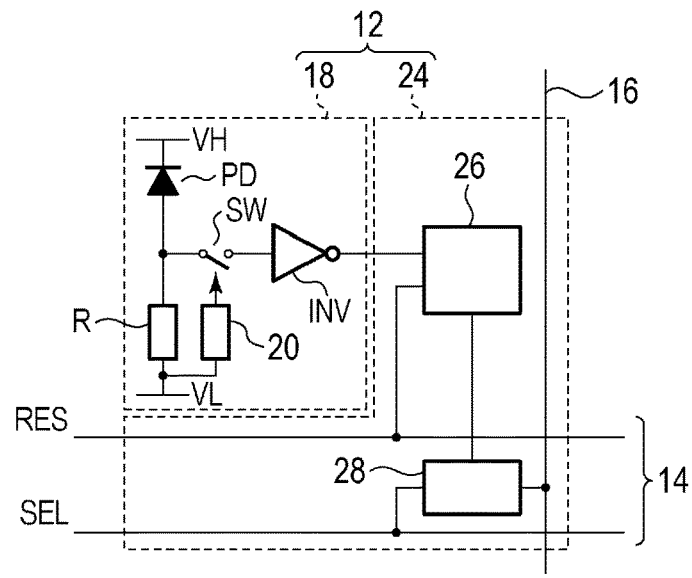

A photo-detection device according to a second embodiment of the present invention will be described with reference to FIG. 7A to FIG. 7C. The same components as those in the photo-detection device according to the first embodiment are labeled with the same reference symbols, and the description thereof will be omitted or simplified. FIG. 7A to FIG. 7C are schematic diagrams illustrating configuration examples of the pixel in the photo-detection device according to the present embodiment.

While the load circuit R is arranged on the side of a node supplied with the voltage VH from a power source and the photoelectric conversion element PD is arranged on the side of a node supplied with the voltage VL from a power source in the pixel 12 of the photo-detection device according to the first embodiment, the arrangements of the load circuit R and the photoelectric conversion element PD can be exchanged. In the present embodiment, configuration examples of the pixel 12 when the arrangements of the load circuit R and the photoelectric conversion element PD are exchanged will be illustrated.

As illustrated in FIG. 7A, the pixel 12 of the photoelectric conversion device according to the present embodiment includes the photoelectric conversion unit 18 and the pixel signal processing unit 24. The photoelectric conversion unit 18 includes the photoelectric conversion element PD, the load circuit R, the waveform shaping circuit INV, the switch SW, and the switch control circuit 20. The pixel signal processing unit 24 includes the counter circuit 26 and the select circuit 28.

The cathode of the photoelectric conversion element PD is connected to a node supplied with the voltage VL from the power source via the load circuit R. The anode of the photoelectric conversion element PD is connected to a node supplied with the voltage VH from the power source via the switch SW. The switch control circuit 20 is connected to a node supplied with the voltage VL from the power source. The input terminal of the waveform shaping circuit INV is connected to the connection node between the photoelectric conversion element PD and the load circuit R. The output terminal of the waveform shaping circuit INV is connected to the counter circuit 26. The counter circuit 26 is connected to the vertical output line 16 via the select circuit 28.

When any of the pixel circuits of FIG. 7A to FIG. 7C is applied, the power source that supplies the voltage VH is a high voltage power source. Typically, this high voltage power source is a power source that supplies a potential difference larger than the withstand voltage of the low voltage operation element forming the waveform shaping circuit INV. If the switch SW is not provided and if the voltage VH is supplied when the voltage VL is not supplied, a high voltage will be applied to the input terminal of the waveform shaping circuit INV, and the waveform shaping circuit INV may be destroyed. With the switch SW and the switch control circuit 20 being provided, however, connection between the power source supplying the voltage VH and the waveform shaping circuit INV is cut off when the voltage VL is not supplied, and it is therefore possible to prevent the waveform shaping circuit INV from being destroyed.

FIG. 7B and FIG. 7C are schematic diagrams illustrating other configuration examples of the pixel 12. FIG. 7B is a configuration example in which the switch SW is arranged between the photoelectric conversion element PD and the load circuit R, and the input terminal of the waveform shaping circuit INV is connected to the connection node between the switch SW and the load circuit R. FIG. 7C is a configuration example in which the switch SW is arranged between the connection node of the photoelectric conversion element PD and the load circuit R and the input terminal of the waveform shaping circuit INV. Also in the configuration examples illustrated in FIG. 7B and FIG. 7C, it is possible to prevent the waveform shaping circuit INV from being destroyed by cutting off the connection between the power source supplying the voltage VL and the waveform shaping circuit INV when the voltage VH is not supplied. The arrangement location of the switch SW may be any position as long as it is on the path that connects the power source supplying the voltage VH and the input terminal of the waveform shaping circuit INV via the photoelectric conversion element PD.

Various circuits that have been described by using FIG. 3A to FIG. 3F in the first embodiment can be applied to the switch SW and the switch control circuit 20.

As described above, according to the present embodiment, since a switch driven in accordance with the connection state of the power source is provided to prevent a high voltage from being applied to the waveform shaping circuit, a reliable photo-detection device can be realized.

Third Embodiment

A photo-detection device according to a third embodiment of the present invention will be described with reference to FIG. 8 and FIG. 9. The same components as those in the photo-detection device according to the first and second embodiments are labeled with the same reference symbols, and the description thereof will be omitted or simplified.

Figure 8:
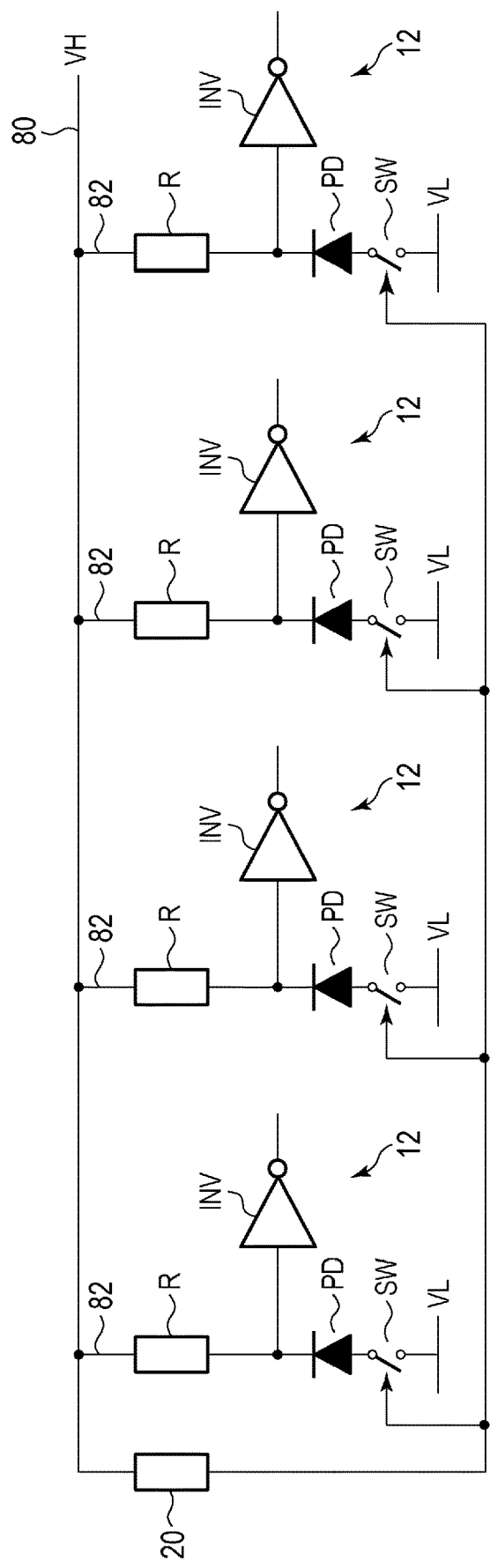
FIG. 8 and FIG. 9 are circuit diagrams illustrating a configuration example of a pixel region of the photo-detection device according to a third embodiment.

FIG. 8 is a schematic diagram illustrating configuration examples of the pixels 12 in the photo-detection device according to the present embodiment. For simplicity here, four pixels 12 connected to one common interconnection 80 supplied with the voltage VH are illustrated. Further, in FIG. 8, only the portion corresponding to the photoelectric conversion unit 18 is illustrated out of the components of the pixels 12.

In the photo-detection device according to the present embodiment, interconnections that supply the voltage VH to respective pixels 12 from the power source are formed of the common interconnection 80 and the branch interconnections 82 branched from the common wring 80 to respective pixels 12 in the same manner as in the first embodiment. The load circuit R of each pixel 12 is connected to the common interconnection 80 via the branch interconnection 82 in the same manner as in the first embodiment. On the other hand, unlike the first embodiment, the switch control circuit 20 is connected to the common interconnection 80 and shared by the plurality of pixels 12. That is, not all the pixels 12 are necessarily required to have the switch control circuit 20, respectively. According to the configuration of the photo-detection device of the present embodiment, the switch control circuit 20 is not necessary for all the pixels 12, and thus the layout area can be reduced.

The pixel configuration illustrated in FIG. 8 can be applied to the pixel groups arranged in a matrix over a plurality of rows and a plurality of columns. FIG. 9 is a configuration example when the plurality of pixels 12 are arranged in a matrix over a plurality of rows and a plurality of columns.

Figure 9:
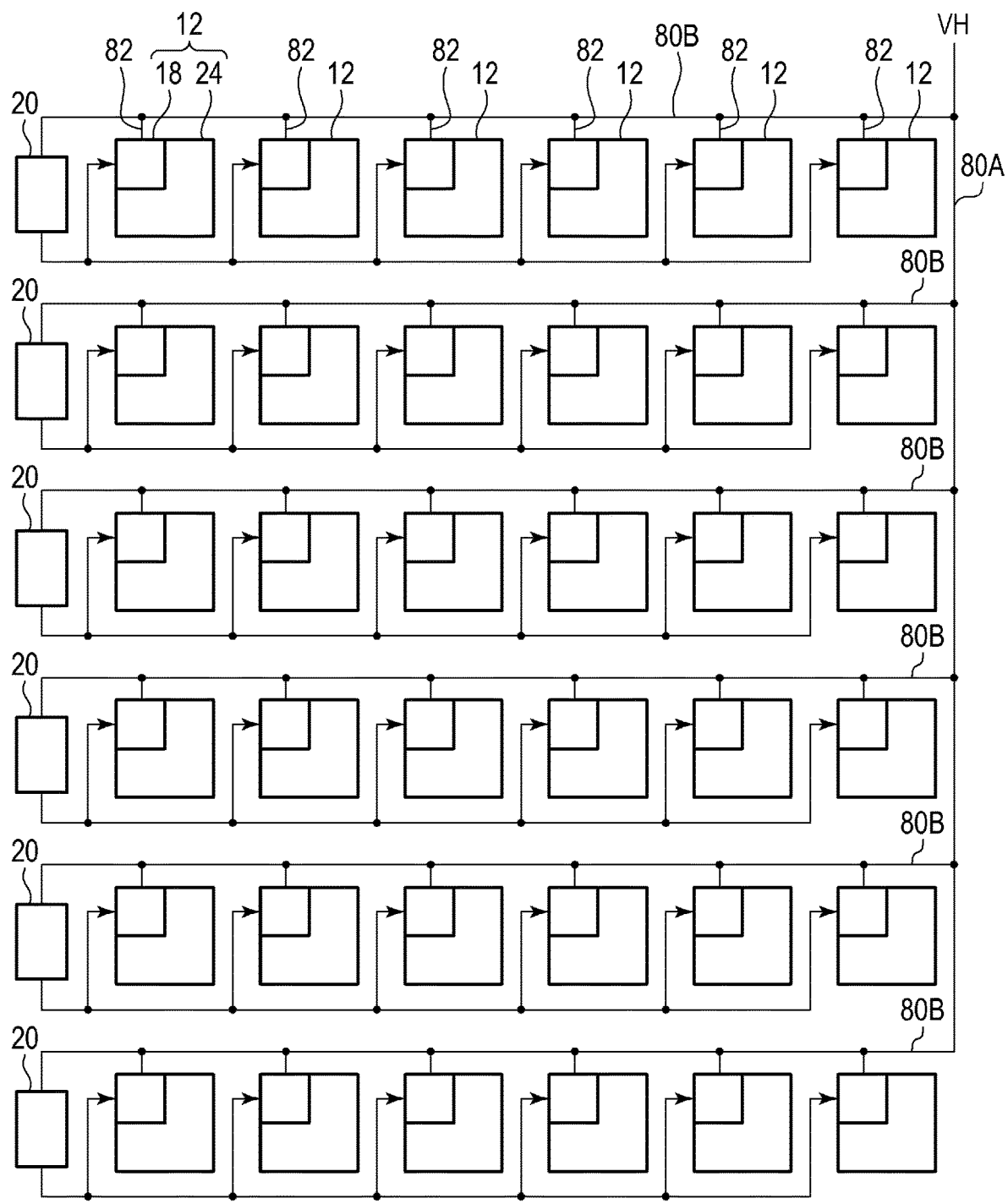

The configuration example of FIG. 9 is an example in which the pixel configuration of FIG. 8 is defined as a basic configuration on each row and expanded to a plurality of rows. In the present configuration example, the common interconnection 80 is formed of a first common interconnection 80A and a plurality of second common interconnections 80B. The first common interconnection 80A is arranged to extend in the column direction (vertical direction in FIG. 9) along one side of the pixel region 10, and the second common interconnections 80B arranged to branch from the first common wring 80A to respective rows and extend in the row direction (horizontal direction in FIG. 9). The plurality of branch interconnections 82 corresponding to the pixels 12 on respective columns are branched from the second common interconnection 80B on each row. Each of the branch interconnections 82 is connected to the photoelectric conversion unit 18 (load circuit R) of corresponding pixel 12. This causes the voltage VH supplied from the power source to be supplied to each pixel 12 via the first common interconnection 80A, the second common interconnection 80B, and the branch interconnection 82 in this order.

Each switch control circuit 20 is arranged on each row and shared by the plurality of pixels 12 arranged on a single row. The connection position of the switch control circuit 20 and the second common interconnection 80B is provided to the end opposite to the connection portion of the first common interconnection 80A and the second common interconnection 80B. That is, the first common interconnection 80A is connected to one end side of the second common interconnection 80B, and the switch control circuit 20 is connected to the other end side of the second common interconnection 80B. According to this configuration, when a disconnection occurs on the second common interconnection 80B on a certain row and the voltage VH cannot be supplied to at least some of the pixels 12 belonging to the certain row, supply of the voltage VL to the pixels 12 on the certain row can be cut off. This can prevent a high voltage from being applied to the waveform shaping circuit INV on a row basis. In this case, while the row on which disconnection occurs on the second common interconnection 80B is in a non-drive state and data cannot be acquired therefrom, it is possible to generate data by interpolation from output from the pixels 12 on the neighboring rows.

Note that, while the switch control circuit 20 and the second common interconnection 80B are connected at the end opposite to the connection portion of the first common interconnection 80A and the second common interconnection 80B in the configuration example of FIG. 9, such a configuration is not necessarily required. The position of the connection portion of the switch control circuit 20 and the common interconnection 80 is not limited in particular and may be provided to any position on the second common interconnection 80B or may be provided on the first common interconnection 80A. Also in this case, when the voltage VH cannot be supplied to at least one pixel 12, supply of the voltage VL to that pixel 12 can be cut off to prevent a high voltage from being applied to the waveform shaping circuit INV.

Further, while a single switch control circuit 20 is arranged on each row in the configuration example of FIG. 9, it is not necessarily required to arrange each one on each row but may arrange each one on a plurality of rows. For example, out of a plurality of rows forming the pixel region 10, one switch control circuit 20 may be shared by the pixels 12 on even-numbered rows, and another switch control circuit 20 may be shared by the pixels 12 on odd-numbered rows.

Further, while the switch control circuit 20 is shared on a row basis in the configuration example of FIG. 9, the switch control circuit 20 may be shared on a column basis.

Further, while the application example to the first embodiment has been described in the present embodiment, it is similarly applicable to the photo-detection device according to the second embodiment.

As described above, according to the present embodiment, since the switch control circuit 20 is shared by the plurality of pixels 12, the layout area of the pixels 12 can be reduced. This can increase the number of pixels that can be arranged on the same area, and higher-definition information can be acquired.

Fourth Embodiment

A photo-detection device according to a fourth embodiment of the present invention will be described with reference to FIG. 10. The same components as those in the photo-detection device according to the first to third embodiments are labeled with the same reference symbols, and the description thereof will be omitted or simplified.

Figure 10:
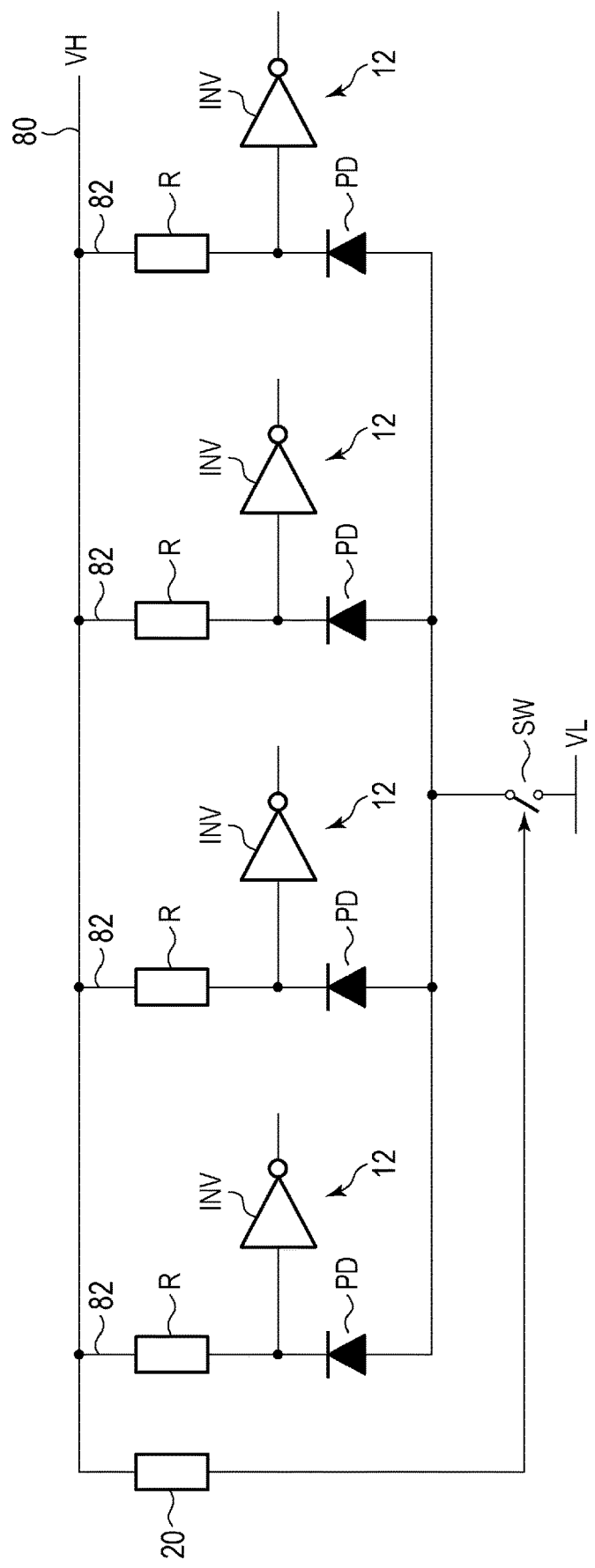
FIG. 10 is a circuit diagram illustrating a configuration example of a pixel region of the photo-detection device according to a forth embodiment.

FIG. 10 is a schematic diagram illustrating a configuration example of the pixels 12 in the photo-detection device according to the present embodiment. FIG. 10 illustrates four pixels 12 connected to one common interconnection 80 supplied with the voltage VH out of the components of the photo-detection device. For simplicity here, only the portion corresponding to the photoelectric conversion unit 18 is illustrated out of the components of the pixels 12.

In the photo-detection device according to the present embodiment, interconnections that supply the voltage VH to respective pixels 12 from the power source are formed of the common interconnection 80 and the branch interconnections 82 branched from the common wring 80 to respective pixels 12 in the same manner as in the first embodiment. The load circuit R of each pixel 12 is connected to the common interconnection 80 via the branch interconnection 82 in the same manner as in the first embodiment. On the other hand, unlike the first embodiment, the switch control circuit 20 is connected to the common interconnection 80 and shared by the plurality of pixels 12. Further, unlike the third embodiment, the switch SW controlled by the switch control circuit 20 is shared by the plurality of pixels 12. That is, not all the pixels 12 are necessarily required to have the switch control circuit 20 and the switch SW, respectively. According to the configuration of the photo-detection device of the present embodiment, the switch control circuit 20 and the switch SW are not necessary for all the pixels 12, and thus the layout area can be further reduced.

The pixel configuration illustrated in FIG. 10 can be applied to the pixel groups arranged in a matrix over a plurality of rows and a plurality of columns in the same manner as in the third embodiment. Further, while the application example to the first embodiment has been described in the present embodiment, it is similarly applicable to the photo-detection device according to the second embodiment.

As described above, according to the present embodiment, since the switch control circuit 20 is shared by the plurality of pixels 12, the layout area of the pixels 12 can be reduced. This can increase the number of pixels that can be arranged on the same area, and higher-definition information can be acquired.

Fifth Embodiment

Figure 11:
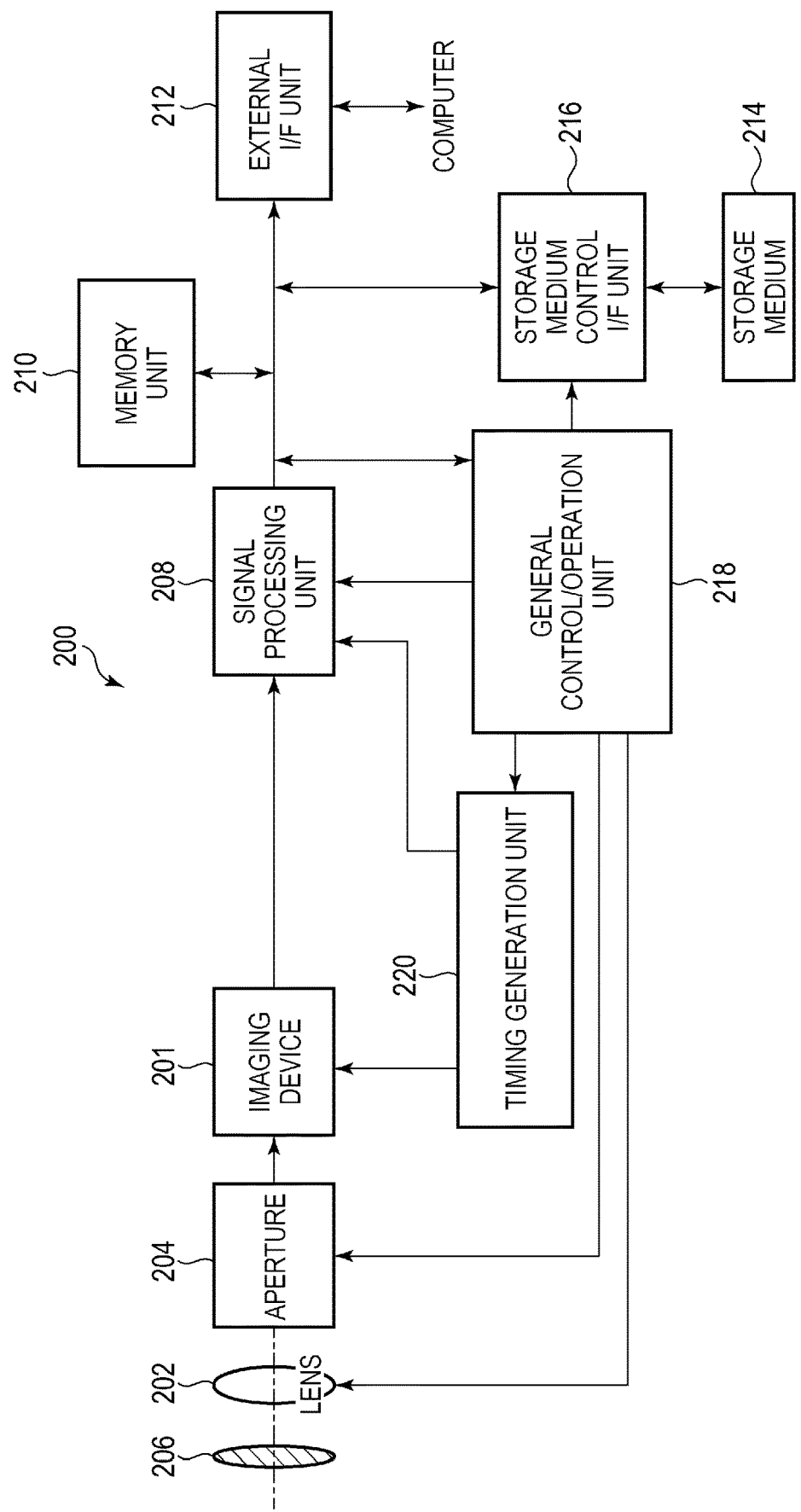
FIG. 11 is a block diagram illustrating the general structure of an imaging system according to a fifth embodiment.

An imaging system according to a fifth embodiment of the present invention will be described with FIG. 11. The same components as those in the photo-detection device according to the first to fourth embodiments are labeled with the same reference symbols, and the description thereof will be omitted or simplified. FIG. 11 is a block diagram illustrating a general configuration of the imaging system according to the present embodiment.

The imaging system 200 of the present embodiment includes an imaging device 201 to which the configuration of the photo-detection device 100 described in any of the first to fourth embodiments described above is applied. Specific examples of the imaging system 200 may include a digital still camera, a digital camcorder, a surveillance camera, and the like. FIG. 11 illustrates a configuration example of a digital still camera to which the photo-detection device 100 described in any of respective embodiments described above is applied.

The imaging system 200 illustrated as an example in FIG. 11 has the imaging device 201, a lens 202 that captures an optical image of a subject onto a capturing surface of the imaging device 201, an aperture 204 for changing a light amount passing through the lens 202, and a barrier 206 for protecting the lens 202. The imaging device 201 corresponds to any of the photo-detection devices 100 described in the first to fourth embodiments described above. The lens 202 and the aperture 204 form an optical system that converges a light onto the imaging device 201.

The imaging system 200 further has a signal processing unit 208 that processes an output signal output from the imaging device 201. The signal processing unit 208 performs a signal processing operation of performing various correction and compression on an input signal for output, if necessary. For example, the signal processing unit 208 applies predetermined image processing such as a conversion process for converting RGB pixel output signals to the Y, Cb, and Cr color space or gamma correction on the input signal.

The imaging system 200 further has a memory unit 210 for temporarily storing image data therein and an external interface unit (external I/F unit) 212 for communicating with an external computer or the like. The imaging system 200 further has a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further has a general control/operation unit 218 that performs various operations and controls the entire digital still camera and a timing generation unit 220 that outputs various timing signals to the imaging device 201 and the signal processing unit 208. Here, the timing signal or the like may be input from the outside, and the imaging system 200 may have at least the imaging device 201 and the signal processing unit 208 that processes an output signal output from the imaging device 201. The general control/operation unit 218 and the timing generation unit 220 may be configured to perform a part or all of the control function of the imaging device 201.

The imaging device 201 outputs an imaging signal to the signal processing unit 208. The signal processing unit 208 performs predetermined signal processing on an imaging signal output from the imaging device 201 and outputs image data. Further, the signal processing unit 208 uses an imaging signal to generate an image. An image generated by the signal processing unit 208 is stored in the storage medium 214, for example. Further, an image generated by the signal processing unit 208 is displayed as a moving image or a static image on a monitor such as a liquid crystal display. The image stored in the storage medium 214 can be hard-copied by a printer or the like.

By using the photo-detection device of each of the embodiments described above to configure an imaging system, a reliable imaging system can be realized.

Sixth Embodiment

Figure 12A:
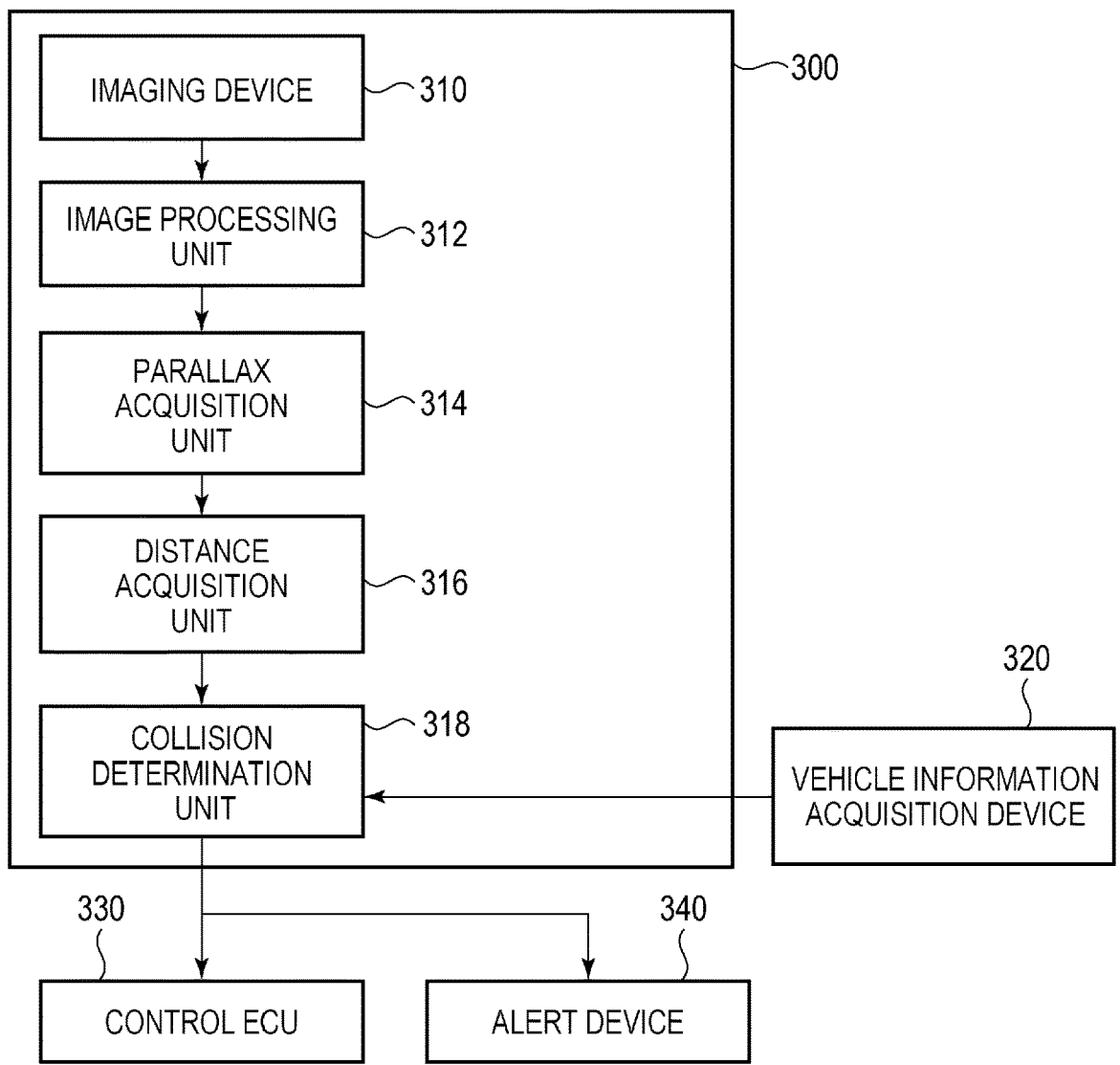
FIG. 12A is a diagram illustrating a configuration example of an imaging system according to a sixth embodiment.
Figure 12B:
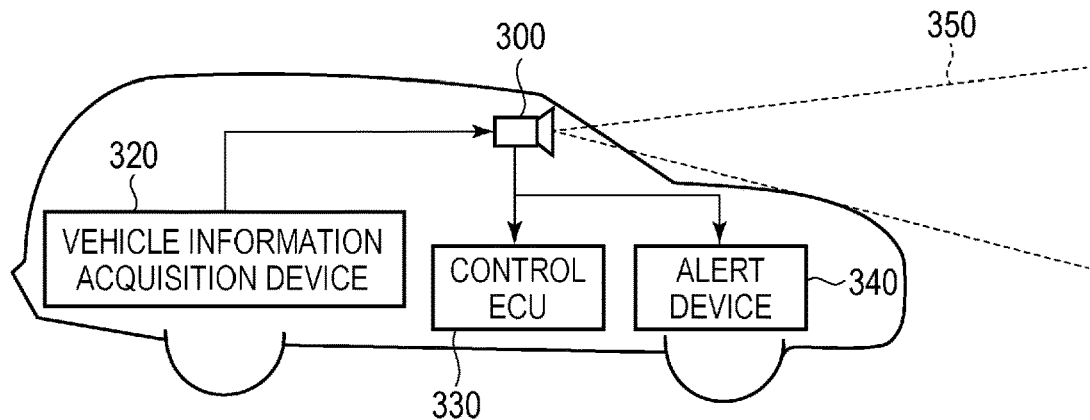
FIG. 12B is a diagram illustrating a configuration example of a movable object according to the sixth embodiment.

An imaging system and a movable object according to a sixth embodiment of the present invention will be described with reference to FIG. 12A and FIG. 12B. FIG. 12A and FIG. 12B are diagrams illustrating a configuration of an imaging system and a movable object according to the present embodiment.

FIG. 12A illustrates an example of an imaging system 300 related to an on-vehicle camera. The imaging system 300 has an imaging device 310. The imaging device 310 is any of the photo-detection devices 100 described in respective embodiments described above. The imaging system 300 has an image processing unit 312 that performs image processing on a plurality of image data acquired by the imaging device 310 and a parallax acquisition unit 314 that calculates a parallax (a phase difference of parallax images) from the plurality of image data acquired by the imaging device 310. Further, the imaging system 300 has a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. That is, the control ECU 330 is an example of a movable object control unit that controls a movable object based on the distance information. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 12B illustrates the imaging system 300 in a case of capturing a front area of a vehicle (a capturing area 350). The vehicle information acquisition device 320 transmits instructions to operate the imaging system 300 to perform capturing an image. A use of the photo-detection device 100 of each of the embodiments described above allows the imaging system 300 of the present embodiment to further improve the ranging accuracy.

Although the example of control for avoiding a collision to another vehicle has been described, the embodiment is applicable to automatic driving control for following another vehicle, automatic driving control for not going out of a traffic lane, or the like. Furthermore, the imaging system is not limited to a vehicle such as the subject vehicle, and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the above-described embodiments, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, the photoelectric conversion element PD illustrated in FIG. 5 is an example, and a photoelectric conversion element PD that can be applied to the present invention is not limited to that illustrated in FIG. 5.

Further, the imaging systems illustrated in the fifth and sixth embodiments are examples of an imaging system to which the photo-detection device of the present invention may be applied, and an imaging system to which the photo-detection device of the present invention can be applied is not limited to those illustrated in FIG. 11 and FIG. 12A and FIG. 12B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-124862, filed Jun. 27, 2017, which is hereby incorporated by reference herein in its entirety.

What is claimed is:

1. A photo-detection device comprising:
   a quench resistor having one terminal connected to a first node;
   a photodiode having one terminal connected to a second node, and being an avalanche photodiode;
   a waveform shaping circuit having an input terminal connected to the other terminal of the quench resistor and the other terminal of the photodiode; and
   a switch including a first terminal connected to the second node and a second terminal connected to the input terminal of the waveform shaping circuit.

2. The photo-detection device according to claim 1 further comprising a switch control circuit,
   wherein the first node is a node connected to a first power source that supplies a first voltage, and
   wherein the switch control circuit controls the switch to a conductive state when the first voltage is supplied to the first node and controls the switch to a non-conductive state when the first voltage is not supplied to the first node.

3. The photo-detection device according to claim 2,
   wherein the second node is a node connected to a second power source that supplies a second voltage lower than the first voltage,
   wherein the first power source is a power source that generates a potential difference lower than or equal to a withstand voltage of an element forming the waveform shaping circuit, and
   wherein the second power source is a power source that generates a potential difference higher than the withstand voltage of the element forming the waveform shaping circuit.

4. The photo-detection device according to claim 3, wherein the photodiode is an avalanche photodiode that operates in a Geiger-mode by a potential difference between the first voltage and the second voltage.

5. The photo-detection device according to claim 3 further comprising a plurality of pixels each including at least the quench resistor and the photodiode,
   wherein the switch control circuit is shared by the plurality of pixels.

6. The photo-detection device according to claim 5, wherein the switch is shared by the plurality of pixels.

7. The photo-detection device according to claim 5 further comprising:
   a plurality of first interconnections each connected to the first node of each of the plurality of pixels; and
   a second interconnection connected to the plurality of first interconnections and supplies the first voltage supplied from the first power source to the plurality of pixels via the plurality of first interconnections,
   wherein the first power source is connected to one end side on the second interconnection, and the switch control circuit is connected to the other end side on the second interconnection.

8. The photo-detection device according to claim 2,
   wherein the second node is a node connected to a second power source that supplies a second voltage higher than the first voltage,
   wherein the second power source is a power source that generates a potential difference lower than or equal to a withstand voltage of an element forming the waveform shaping circuit, and wherein the first power source is a power source that generates a potential difference higher than the withstand voltage of the element forming the waveform shaping circuit.

9. The photo-detection device according to claim 8 further comprising a plurality of pixels each including at least the quench resistor and the photodiode,
   wherein the switch control circuit is shared by the plurality of pixels.

10. The photo-detection device according to claim 9, wherein the switch is shared by the plurality of pixels.

11. The photo-detection device according to claim 9 further comprising:
    a plurality of first interconnections each connected to the first node of each of the plurality of pixels; and
    a second interconnection connected to the plurality of first interconnections and supplies the first voltage supplied from the first power source to the plurality of pixels via the plurality of first interconnections,
    wherein the first power source is connected to one end side on the second interconnection, and the switch control circuit is connected to the other end side on the second interconnection.

12. The photo-detection device according to claim 2 further comprising a plurality of pixels each including at least the quench resistor and the photodiode,
    wherein the switch control circuit is shared by the plurality of pixels.

13. The photo-detection device according to claim 12, wherein the switch is shared by the plurality of pixels.

14. The photo-detection device according to claim 12 further comprising:
    a plurality of first interconnections each connected to the first node of each of the plurality of pixels; and
    a second interconnection connected to the plurality of first interconnections and supplies the first voltage supplied from the first power source to the plurality of pixels via the plurality of first interconnections,
    wherein the first power source is connected to one end side on the second interconnection, and the switch control circuit is connected to the other end side on the second interconnection.

15. The photo-detection device according to claim 14,
    wherein the plurality of pixels form one row or one column, and
    wherein a plurality of second interconnections arranged on a plurality of rows or a plurality of columns are connected to a third interconnection.

16. The photo-detection device according to claim 2, wherein the switch control circuit is connected between the first node and the second node and includes an impedance element that defines a voltage of a control signal supplied to the switch.

17. The photo-detection device according to claim 16, wherein the switch control circuit further includes a current source that defines a current flowing in the impedance element.

18. An imaging system comprising:
    the photo-detection device according to claim 1; and
    a signal processing unit that processes a signal output from the photo-detection device.

19. A movable object comprising:
    the photo-detection device according to claim 1;
    a distance information acquisition unit that acquires distance information on a distance to an object, from parallax images based on a signal from the photo-detection device; and
    a control unit that controls the movable object based on the distance information.

20. The photo-detection device according to claim 1, wherein the switch further includes a third terminal to which a control signal from a switch control circuit for controlling a conductive state and a non-conductive state of the switch is applied.

* * * * *